(12) United States Patent
Muramatsu et al.

(10) Patent No.: US 9,748,101 B2
(45) Date of Patent: Aug. 29, 2017

(54) SUBSTRATE TREATMENT METHOD, COMPUTER STORAGE MEDIUM, AND SUBSTRATE TREATMENT SYSTEM

(71) Applicant: Tokyo Electron Limited, Tokyo (JP)

(72) Inventors: Makoto Muramatsu, Koshi (JP); Takahiro Kitano, Koshi (JP); Tadatoshi Tomita, Koshi (JP); Keiji Tanouchi, Nirasaki (JP); Soichiro Okada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 204 days.

(21) Appl. No.: 14/430,988

(22) PCT Filed: Sep. 27, 2013

(86) PCT No.: PCT/JP2013/076288
§ 371 (c)(1),
(2) Date: Mar. 25, 2015

(87) PCT Pub. No.: WO2014/051063
PCT Pub. Date: Apr. 3, 2014

(65) Prior Publication Data
US 2015/0255271 A1    Sep. 10, 2015

(30) Foreign Application Priority Data

Sep. 28, 2012 (JP) .................. 2012-215674
Mar. 8, 2013 (JP) .................. 2013-046512

(51) Int. Cl.
*G03B 27/32* (2006.01)
*H01L 21/027* (2006.01)
(Continued)

(52) U.S. Cl.
CPC ........ *H01L 21/0274* (2013.01); *G03F 7/0002* (2013.01); *G03F 7/16* (2013.01);
(Continued)

(58) Field of Classification Search
CPC .......... G03F 7/0002; G03F 7/16; G03F 7/405; H01J 37/32889; H01L 21/0271;
(Continued)

(56) References Cited

U.S. PATENT DOCUMENTS 7,521,090 B1 * 4/2009 Cheng .................. B05D 5/00
427/256
7,521,094 B1 * 4/2009 Cheng .................. B82Y 10/00
427/385.5
(Continued)

FOREIGN PATENT DOCUMENTS

| JP | 2008-036491 A | 2/2008 |
| JP | 2012-022244 A | 2/2012 |
| JP | 2012-061531 A | 3/2012 |

OTHER PUBLICATIONS

International Search Report of the International Searching Authority mailed Dec. 10, 2013 for the corresponding International application No. PCT/JP2013/076288 (and English translation).

*Primary Examiner* — Deoram Persaud
(74) *Attorney, Agent, or Firm* — Posz Law Group, PLC

(57) ABSTRACT

The present invention is configured to: form, on a substrate, a neutral layer having an intermediate affinity to a hydrophilic polymer and a hydrophobic polymer; form a resist pattern by performing exposure processing on a resist film formed on the neutral layer and then developing the resist film after the exposure processing; perform a surface treatment on the resist pattern by supplying an organic solvent having a polarity to the resist pattern; apply the block copolymer onto the neutral layer; and phase-separate the block copolymer on the neutral layer into the hydrophilic polymer and the hydrophobic polymer.

22 Claims, 13 Drawing Sheets

(51) Int. Cl.
*G03F 7/16* (2006.01)
*G03F 7/40* (2006.01)
*G03F 7/00* (2006.01)
*H01J 37/32* (2006.01)
*H01L 21/311* (2006.01)
*H01L 21/67* (2006.01)

(52) U.S. Cl.
CPC ........ *G03F 7/405* (2013.01); *H01J 37/32889* (2013.01); *H01L 21/0271* (2013.01); *H01L 21/0273* (2013.01); *H01L 21/31133* (2013.01); *H01L 21/31138* (2013.01); *H01L 21/6715* (2013.01); *H01L 21/67253* (2013.01)

(58) Field of Classification Search
CPC ............ H01L 21/0273; H01L 21/0274; H01L 21/31133; H01L 21/31138; H01L 21/6715; H01L 21/67253
See application file for complete search history.

(56) References Cited

U.S. PATENT DOCUMENTS

| | | | | |
|---|---|---|---|---|
| 8,691,925 B2* | 4/2014 | Wu | ....................... | C08F 293/00 430/296 |
| 8,821,978 B2* | 9/2014 | Cheng | ................. | B81C 1/00031 427/258 |
| 9,465,295 B2* | 10/2016 | Matsunaga | ........... | G03F 7/2024 |
| 2006/0043358 A1* | 3/2006 | Ueda | ....................... | C08G 61/12 257/40 |
| 2006/0275987 A1* | 12/2006 | Park | ........................ | H01J 9/025 438/264 |
| 2009/0186234 A1* | 7/2009 | Colburn | ................. | C08F 255/00 428/500 |
| 2012/0244474 A1* | 9/2012 | Asakawa | ............ | B81C 1/00031 430/296 |
| 2013/0243958 A1* | 9/2013 | Senzaki | .................. | C09D 133/18 427/264 |
| 2013/0252179 A1* | 9/2013 | Senzaki | ................. | C09J 133/26 430/325 |
| 2014/0030652 A1* | 1/2014 | Senzaki | ................. | C08L 53/00 430/270.1 |
| 2014/0308462 A1* | 10/2014 | Nara | .................... | G02B 5/3083 428/1.2 |
| 2015/0228512 A1* | 8/2015 | Muramatsu | ........... | G03F 7/0002 438/694 |
| 2016/0124307 A1* | 5/2016 | Muramatsu | ....... | H01L 21/67028 355/27 |

* cited by examiner

SUBSTRATE TREATMENT METHOD, COMPUTER STORAGE MEDIUM, AND SUBSTRATE TREATMENT SYSTEM

TECHNICAL FIELD

The present invention relates to a substrate treatment method, a computer storage medium, and a substrate treatment system, using a block copolymer containing a hydrophilic polymer having a hydrophilic property and a hydrophobic polymer having a hydrophobic property.

This application is a U.S. national stage of PCT/JP2013/076288 filed on Sep. 27, 2013, and is based upon and claims the benefit of priority of the prior Japanese Patent Application No. 2012-215674, filed in Japan on Sep. 28, 2012, and the prior Japanese Patent Application No. 2013-46512, filed in Japan on Mar. 8, 2013, the entire contents of which are incorporated herein by reference.

BACKGROUND ART

For example, in a manufacturing process of a semiconductor device, photolithography processing is performed in which a resist coating treatment of applying a resist solution onto, for example, a semiconductor wafer (hereinafter, referred to as a "wafer") to form a resist film, exposure processing of exposing the resist film to a predetermined pattern, a developing treatment of developing the exposed resist film and so on are performed in sequence to form a predetermined resist pattern on the wafer. Then, using the resist pattern as a mask, an etching treatment is performed on a film to be treated on the wafer and a removal treatment of the resist film is then performed, to form a predetermined pattern in the film to be treated.

Incidentally, miniaturization of the above-described pattern of the film to be treated is required in recent years in order for higher integration of the semiconductor device. Therefore, miniaturization of the resist pattern is in progress and, for example, the wavelength of light for the exposure processing in the photolithography processing is being shortened. However, there are technical and cost limits in shortening the wavelength of an exposure light source, and it is now difficult to form a fine resist pattern at a level of, for example, several nanometers only by the method of increasingly shortening the wavelength of light.

Hence, there is a proposed wafer treatment method using a block copolymer composed of two kinds of, hydrophilic and hydrophobic block, chains (polymers) (Patent Document 1). In this method, first, a neutral layer having an intermediate affinity to the two kinds of polymers is formed on the wafer, and a guide pattern is formed, for example, of a resist on the neutral layer. Thereafter, the block copolymer is applied onto the neutral layer, and the block copolymer is phase-separated into the two kinds of, hydrophilic and hydrophobic, polymers to form a lamellar structure. Thereafter, one of the polymers is selectively removed, for example, by etching or the like to form a fine pattern composed of the other polymer on the wafer. Then, the pattern of the polymer is used as a mask, an etching treatment is performed on the film to be treated to form a predetermined pattern in the film to be treated.

[Patent Document 1] Japanese Patent Application Laid-open No. 2008-36491

DISCLOSURE OF THE INVENTION

Problems to be Solved by the Invention

However, the present inventors confirmed that when applying the block copolymer onto the neutral layer using the resist as the guide pattern and phase-separating the block copolymer as described above, it sometimes failed to separate the block copolymer in the lamellar structure in a desired pattern. Normally, since the resist pattern after the development is hydrophobic, the hydrophobic polymer is arrayed along a longitudinal direction of the resist pattern, whereby the lamellar structure is formed along the longitudinal direction of the resist pattern. However, the hydrophilic polymer and the hydrophobic polymer are not arrayed along the longitudinal direction of the resist pattern so that the lamellar structure is disorderly formed with respect to the resist pattern in some cases.

The present inventors found, from earnest study regarding this point, that there was a portion which was not hydrophilic due to change in physical property of the resist on a side wall of the resist pattern. This is presumed to be because when performing exposure processing on a resist film R on a wafer W, a resist changed in physical property is generated in an intermediate region (hereinafter, the intermediate region is sometimes referred to as an "intermediately exposed region") 603 between an exposed region 600 which is exposed to light and an unexposed region 602 which is not exposed to light because light is blocked out by a mask 601 as illustrated in FIG. 19. Note that a numeral 604 in FIG. 19 denotes a neutral layer having an intermediate affinity to the hydrophilic polymer and the hydrophobic polymer.

When developing the resist film, the resist film in the intermediately exposed region 603 is not developed but remains on the entire surface of the resist pattern or the intermediately exposed region 603 and the unexposed region 602 exist in a mixed manner. As a result, the hydrophilic polymer and the hydrophobic polymer are disorderly arrayed with respect to the resist pattern.

The present invention has been made in consideration of the above points and has an object to appropriately form a predetermined pattern on a substrate in a substrate treatment using a block copolymer containing a hydrophilic polymer and a hydrophobic polymer.

Means for Solving the Problems

To achieve the above object, the present invention is a method of treating a substrate using a block copolymer containing a hydrophilic polymer and a hydrophobic polymer, the method including: a neutral layer forming step of forming, on the substrate, a neutral layer having an intermediate affinity to the hydrophilic polymer and the hydrophobic polymer; a resist pattern forming step of forming a resist pattern by performing exposure processing on a resist film formed on the neutral layer and then developing the resist film after the exposure processing; a resist pattern treatment step of performing a surface treatment on the resist pattern by supplying an organic solvent having a polarity to the resist pattern; a block copolymer coating step of applying the block copolymer onto the neutral layer; and a polymer separation step of phase-separating the block copolymer on the neutral layer into the hydrophilic polymer and the hydrophobic polymer.

According to the present invention, the organic solvent having a polarity is supplied to perform a surface treatment on the resist pattern in the resist pattern treatment step, thereby making it possible to remove a portion (low in hydrophobic degree) which is not always hydrophobic due to alteration of the resist, to bare the unexposed region having a sufficient hydrophobic degree. Accordingly, the hydrophobic polymer becomes more likely to be drawn to the resist pattern having a hydrophobic property, so that it is possible to prevent the polymers from being disorderly arrayed when phase-separating the block copolymer so as to form a predetermined pattern. A desired fine pattern can be appropriately formed on the substrate as described above, so that the etching treatment for the film to be treated using the pattern of the hydrophilic polymer or the hydrophobic polymer as a mask can be appropriately performed to thereby form a predetermined pattern in the film to be treated.

The present invention according to another aspect is a computer-readable storage medium storing a program running on a computer of a control unit controlling a substrate treatment system to cause the substrate treatment system to perform the substrate treatment method.

The present invention according to still another aspect is a system for treating a substrate using a block copolymer containing a hydrophilic polymer and a hydrophobic polymer, the system including: a neutral layer forming apparatus that forms, on the substrate, a neutral layer having an intermediate affinity to the hydrophilic polymer and the hydrophobic polymer; a developing apparatus that forms a resist pattern by performing a developing treatment on a resist film after exposure processing formed on the neutral layer; a resist pattern treatment apparatus that performs a surface treatment on the resist pattern by supplying an organic solvent having a polarity to the resist pattern after the developing treatment; a block copolymer coating apparatus that applies the block copolymer onto the neutral layer; and a polymer separation apparatus that phase-separates the block copolymer on the neutral layer into the hydrophilic polymer and the hydrophobic polymer.

Effect of the Invention

According to the present invention, a predetermined pattern can be appropriately formed on a substrate in a substrate treatment using a block copolymer containing a hydrophilic polymer and a hydrophobic polymer.

BEST MODE FOR CARRYING OUT THE INVENTION

Figure 1:
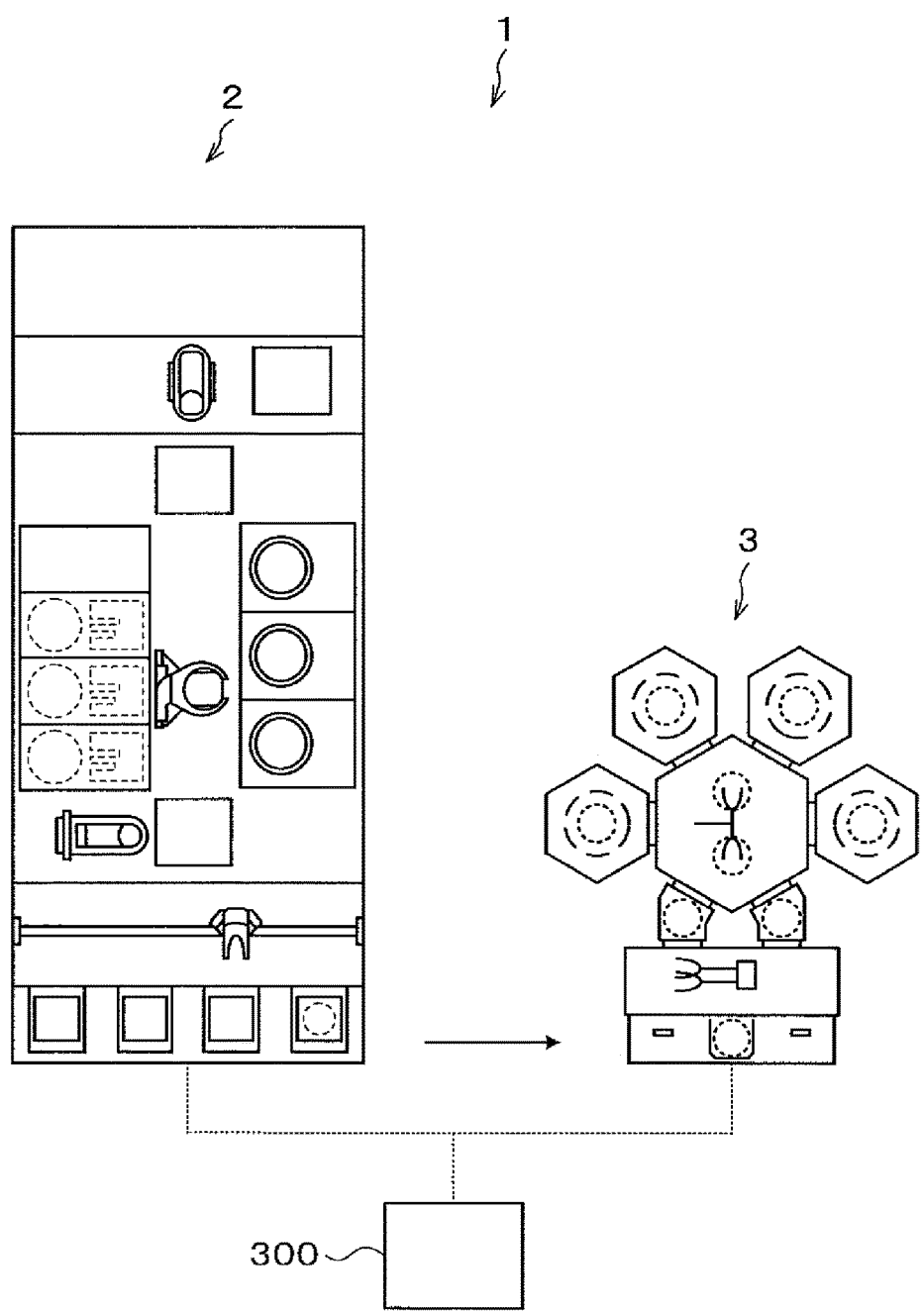
FIG. 1 An explanatory view illustrating the outline of a configuration of a substrate treatment system according to an embodiment.

Hereinafter, an embodiment of the present invention will be described. FIG. 1 is an explanatory view illustrating the outline of a configuration of a substrate treatment system 1 according to this embodiment.

The substrate treatment system 1 has a coating and developing treatment apparatus 2 that performs photolithography processing on a wafer as a substrate and an etching treatment apparatus 3 that performs an etching treatment on the wafer W as illustrated in FIG. 1. Note that a film to be treated (not illustrated) has been formed beforehand on the wafer to be treated in the substrate treatment system 1.

Figure 2:
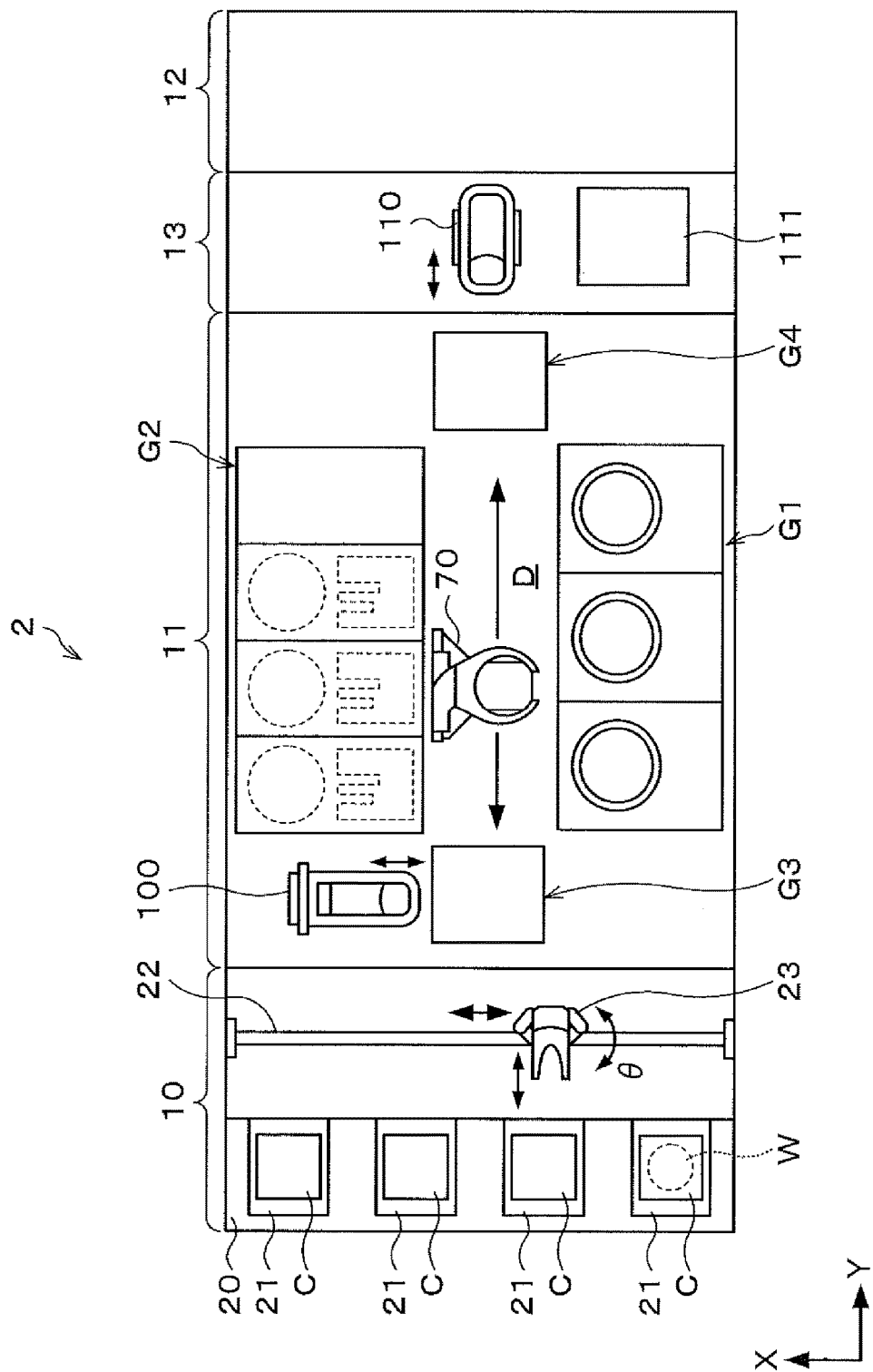
FIG. 2 A plan view illustrating the outline of a configuration of a coating and developing treatment apparatus.

The coating and developing treatment apparatus 2 has, as illustrated in FIG. 2, a configuration in which, for example, a cassette station 10 to/from which a cassette C housing a plurality of wafers W is transferred in/out from/to the outside, a treatment station 11 which includes a plurality of various kinds of treatment apparatuses that perform predetermined treatments in a single-wafer manner in the photolithography processing, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with, a plurality of, for example, four cassette mounting plates 21. The cassette mounting plates 21 are provided, arranged side by side in a line in an X-direction (a top-down direction in FIG. 2) that is the horizontal direction. On the cassette mounting plates 21, cassettes C can be mounted when the cassettes C are transferred in/out from/to the outside of the coating and developing treatment apparatus 2.

In the cassette station 10, a wafer transfer apparatus 23 is provided which is movable on a transfer path 22 extending in the X-direction as illustrated in FIG. 2. The wafer transfer apparatus 23 is movable also in a vertical direction and around a vertical axis (in a θ-direction), and can transfer the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (X-direction negative direction side in FIG. 2) in the treatment station 11, and the second block G2 is provided on the rear side (X-direction positive direction side in FIG. 2) in the treatment station 11. Further, the third block G3 is provided on the cassette station 10 side (Y-direction negative direction side in FIG. 2) in the treatment station 11, and the fourth block G4 is provided on the interface station 13 side (Y-direction positive direction side in FIG. 2) in the treatment station 11.

Figure 3:
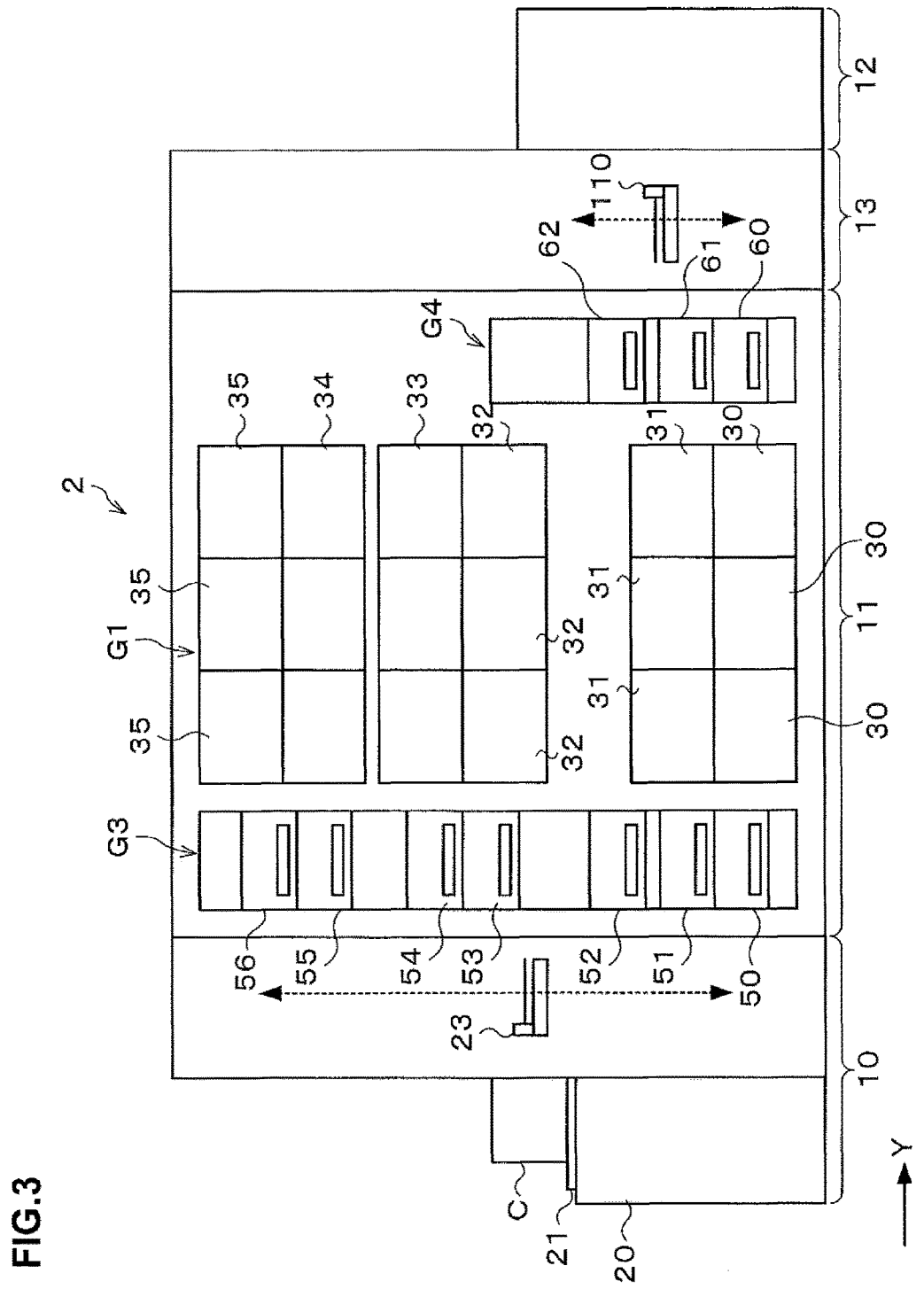
FIG. 3 A side view illustrating the outline of an internal configuration of the coating and developing treatment apparatus.

For example, in the first block G1, as illustrated in FIG. 3, a plurality of solution treatment apparatuses, for example, developing apparatuses 30 each of which performs a developing treatment on the wafer W, organic solvent supply apparatuses 31 as resist pattern treatment apparatuses each of which supplies an organic solvent having a polarity to a resist pattern after development to perform a surface treatment on the resist pattern, anti-reflection film forming apparatuses 32 each of which forms an anti-reflection film on the wafer, neutral layer forming apparatuses 33 each of which applies a neutralizing agent onto the wafer W to form a neutral layer, resist coating apparatuses 34 each of which applies a resist solution onto the wafer W to form a resist film, and block copolymer coating apparatuses 35 each of which applies a block copolymer onto the wafer W, are stacked in order from the bottom. Note that as the resist in this embodiment, for example, an ArF resist that is a positive resist is used.

For example, three pieces of each of the developing apparatus 30, the organic solvent supply apparatus 31, the anti-reflection film forming apparatus 32, the neutral layer forming apparatus 33, the resist coating apparatus 34, and the block copolymer coating apparatus 35 are arranged side by side in the horizontal direction. Note that the numbers and the arrangement of the developing apparatuses 30, the organic solvent supply apparatuses 31, the anti-reflection film forming apparatuses 32, the neutral layer forming apparatuses 33, the resist coating apparatuses 34, and the block copolymer coating apparatuses 35 can be arbitrarily selected.

In the developing apparatus 30, the organic solvent supply apparatus 31, the anti-reflection film forming apparatus 32, the neutral layer forming apparatus 33, the resist coating apparatus 34, and the block copolymer coating apparatus 35, for example, spin coating of applying a predetermined coating solution onto the wafer W is performed. In the spin coating, the coating solution is discharged, for example, from a coating nozzle onto the wafer W and the wafer W is rotated to diffuse the coating solution over the front surface of the wafer W. The configurations of these solution treatment apparatuses will be described later.

Note that the block copolymer to be applied onto the wafer W in the block copolymer coating apparatus 35 has a hydrophobic (nonpolar) polymer having a hydrophobic property (no polarity) and a hydrophilic (polar) polymer having a hydrophilic property (polarity). In this embodiment, for example, polymethyl methacrylate (PMMA) is used as the hydrophilic polymer and, for example, polystyrene (PS) is used as the hydrophobic polymer. Further, the ratio of a molecular weight of the hydrophilic polymer in the block copolymer is 40% to 60%, and the ratio of a molecular weight of the hydrophobic polymer in the block copolymer is 60% to 40%. Besides, the block copolymer is a macromolecule in which the hydrophilic polymer and the hydrophobic polymer are linearly combined.

Further, the neutral layer formed on the wafer W in the neutral layer forming apparatus 33 has an intermediate affinity to the hydrophilic polymer and the hydrophobic polymer. In this embodiment, for example, a random copolymer or an alternating copolymer of polymethyl methacrylate and polystyrene is used as the neutral layer. Hereinafter, "neutral" means the case having the intermediate affinity to the hydrophilic polymer and the hydrophobic polymer as described above.

Figure 4:
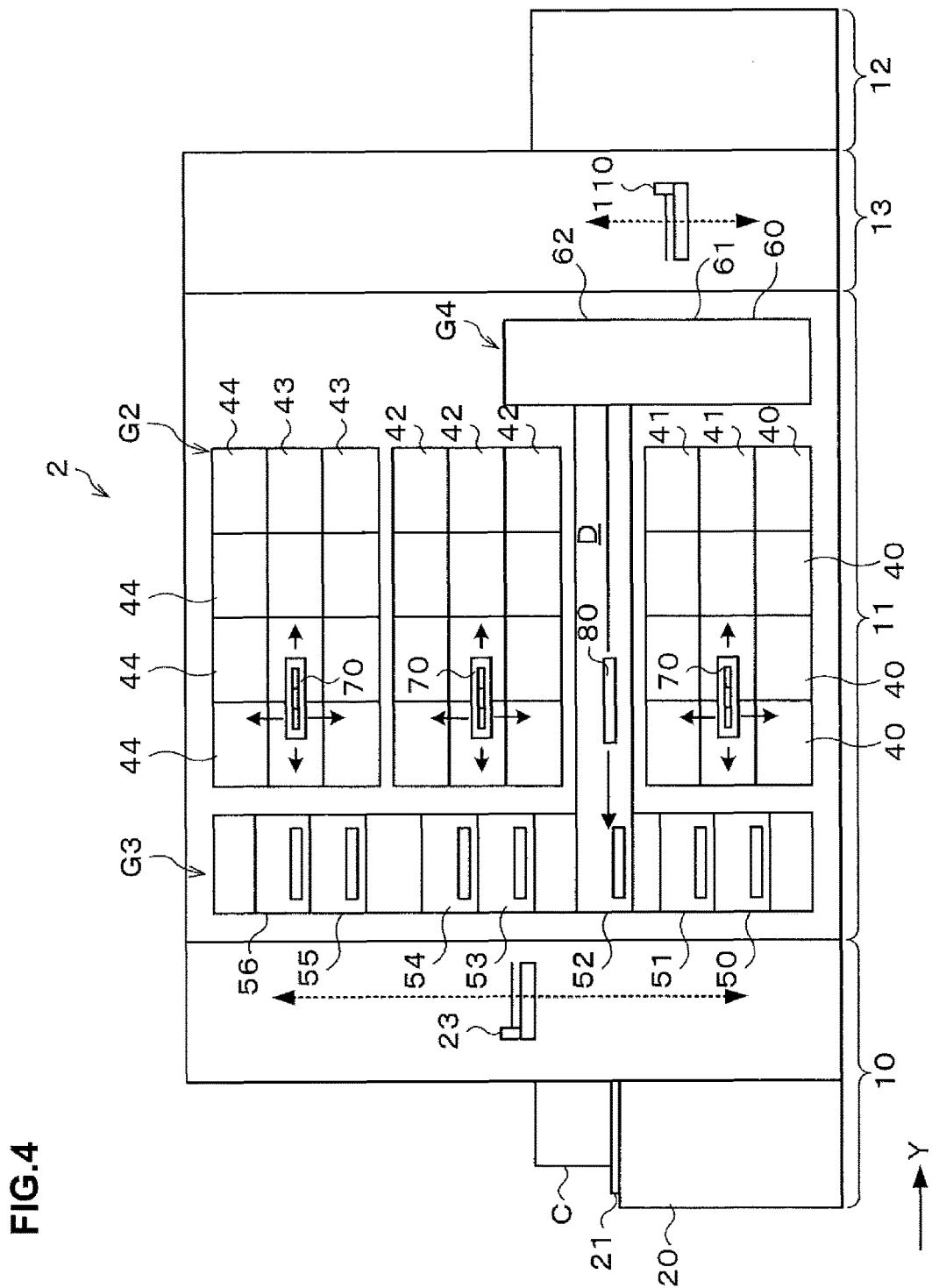
FIG. 4 A side view illustrating the outline of the internal configuration of the coating and developing treatment apparatus.

For example, in the second block G2, as illustrated in FIG. 4, thermal treatment apparatuses 40 each of which performs a thermal treatment on the wafer W, ultraviolet irradiation apparatuses 41 as resist modification processing apparatuses each of which applies ultraviolet light to the resist pattern on the wafer W to perform modification processing on the surface of the resist pattern, adhesion apparatuses 42 each of which performs a hydrophobic treatment on the wafer W, edge exposure apparatuses 43 each of which exposes the outer peripheral portion of the wafer W, and polymer separation apparatuses 44 each of which phase-separates the block copolymer applied on the wafer W in the block copolymer coating apparatuses 35 into the hydrophilic polymer and the hydrophobic polymer, are arranged side by side in the vertical direction and in the horizontal direction. The thermal treatment apparatus 40 has a hot plate which mounts and heats the wafer W thereon and a cooling plate which mounts and cools the wafer W thereon, and thereby can perform both of a heat treatment and a cooling treatment. Note that the polymer separation apparatus 44 is also an apparatus that performs a thermal treatment on the wafer W and its configuration is the same as that of the thermal treatment apparatus 40. The ultraviolet irradiation apparatus 41 has a mounting table on which the wafer W is to be mounted and an ultraviolet irradiation unit which applies ultraviolet light with a wavelength of, for example, 172 nm or 222 nm to the wafer W on the mounting table. Besides, the numbers and the arrangement of the thermal treatment apparatuses 40, the ultraviolet irradiation apparatuses 41, the adhesion apparatuses 42, the edge exposure apparatuses 43, and the polymer separation apparatuses 44 can be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer transfer region D is formed in a region surrounded by the first block G1 to the fourth block G4 as illustrated in FIG. 2. In the wafer transfer region D, for example, a wafer transfer apparatus 70 is arranged.

The wafer transfer apparatus 70 has a transfer arm that is movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 and the fourth block G4 therearound.

A plurality of the wafer transfer apparatuses 70 are arranged, for example, one above the other as illustrated in FIG. 4 and can transfer the wafers W, for example, to predetermined apparatuses in the blocks G1 to G4 at about the same levels as them.

In the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 2, a wafer transfer apparatus 100 is provided adjacent on the X-direction positive direction side of the third block G3. The wafer transfer apparatus 100 has a transfer arm that is movable, for example, in the X-direction, the θ-direction, and the vertical direction. The wafer transfer apparatus 100 can move up and down while supporting the wafer W to transfer the wafer W to each of the delivery apparatuses in the third block G3.

In the interface station 13, a wafer transfer apparatus 110 and a delivery apparatus 111 are provided. The wafer transfer apparatus 110 has a transfer arm that is movable, for example, in the Y-direction, the θ-direction, and the vertical direction. The wafer transfer apparatus 110 can transfer the wafer W to/from each of the delivery apparatuses in the fourth block G4, the delivery apparatus 111 and the exposure apparatus 12, for example, while supporting the wafer W by the transfer arm.

Figure 5:
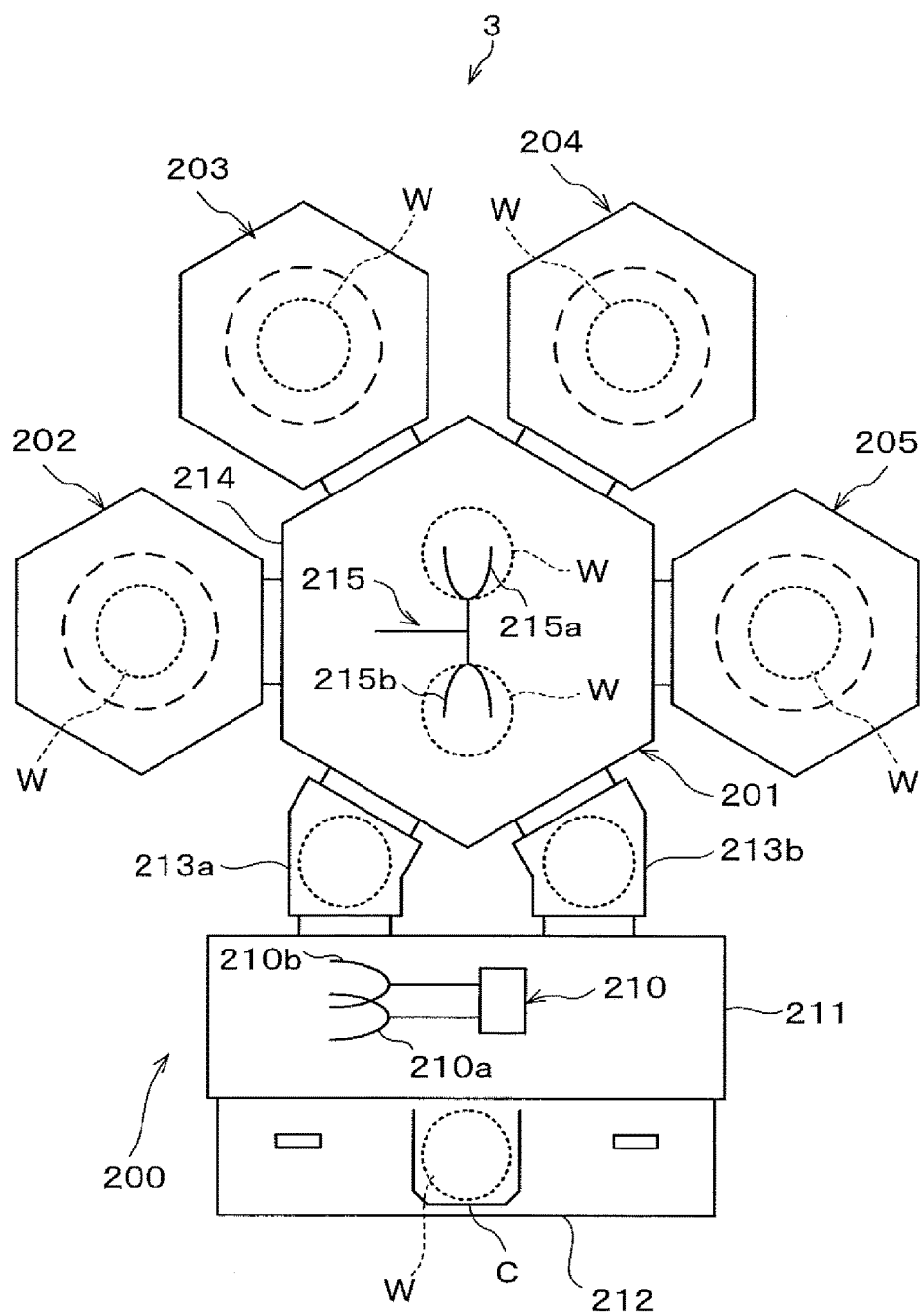
FIG. 5 A plan view illustrating the outline of a configuration of an etching treatment apparatus.

The etching treatment apparatus 3 has, as illustrated in FIG. 5, a cassette station 200 from/to which the wafer W is transferred into/out of the etching treatment apparatus 3, a common transfer unit 201 which transfers the wafer W, etching apparatuses 202, 203 as polymer removing apparatuses each of which performs an etching treatment on the block copolymer phase-separated on the wafer W to selectively remove either the hydrophilic polymer or the hydrophobic polymer, and etching apparatuses 204, 205 each of which etches the film to be treated on the wafer W into a predetermined pattern.

The cassette station 200 has a transfer room 211 in which a wafer transfer mechanism 210 which transfers the wafer W is provided. The wafer transfer mechanism 210 has two transfer arms 210a, 210b each of which substantially horizontally holds the wafer W, and is configured to transfer the wafer W while holding the wafer W by one of the transfer arms 210a and 210b. On the side of the transfer room 211, a cassette mounting table 212 is provided on which a cassette C capable of housing a plurality of wafers W arranged side by side therein is mounted. In the illustrated example, a plurality of, for example, three cassettes C can be mounted on the cassette mounting table 212.

The transfer room 211 and the common transfer unit 201 are coupled to each other via two load-lock apparatuses 213a and 213b which can be evacuated.

The common transfer unit 201 has a transfer room chamber 214 having a hermetically closable structure formed in a substantially polygonal shape (a hexagonal shape in the illustrated example) as seen from above. In the transfer room chamber 214, a wafer transfer mechanism 215 which transfers the wafer W is provided. The wafer transfer mechanism 215 has two transfer arms 215a, 215b each of which substantially horizontally holds the wafer W, and is configured to transfer the wafer W while holding the wafer W by one of the transfer arms 215a and 215b.

Outside the transfer room chamber 214, the etching apparatuses 202, 203, 204, 205 and the load-lock apparatuses 213b, 213a are arranged to surround the periphery of the transfer room chamber 214. The etching apparatuses 202, 203, 204, 205 and the load-lock apparatuses 213b, 213a are arranged, for example, side by side in this order in the clockwise direction as seen from above and opposed to six side surface portions of the transfer room chamber 214 respectively.

Note that as the etching apparatuses 202 to 205, for example, RIE (Reactive Ion Etching) apparatuses are used. Namely, in each of the etching apparatuses 202 to 205, dry etching of etching the hydrophobic polymer or the film to be treated is performed, for example, with a reactive gas (etching gas) such as oxygen ($O_2$), ions, or radicals.

Figure 6:
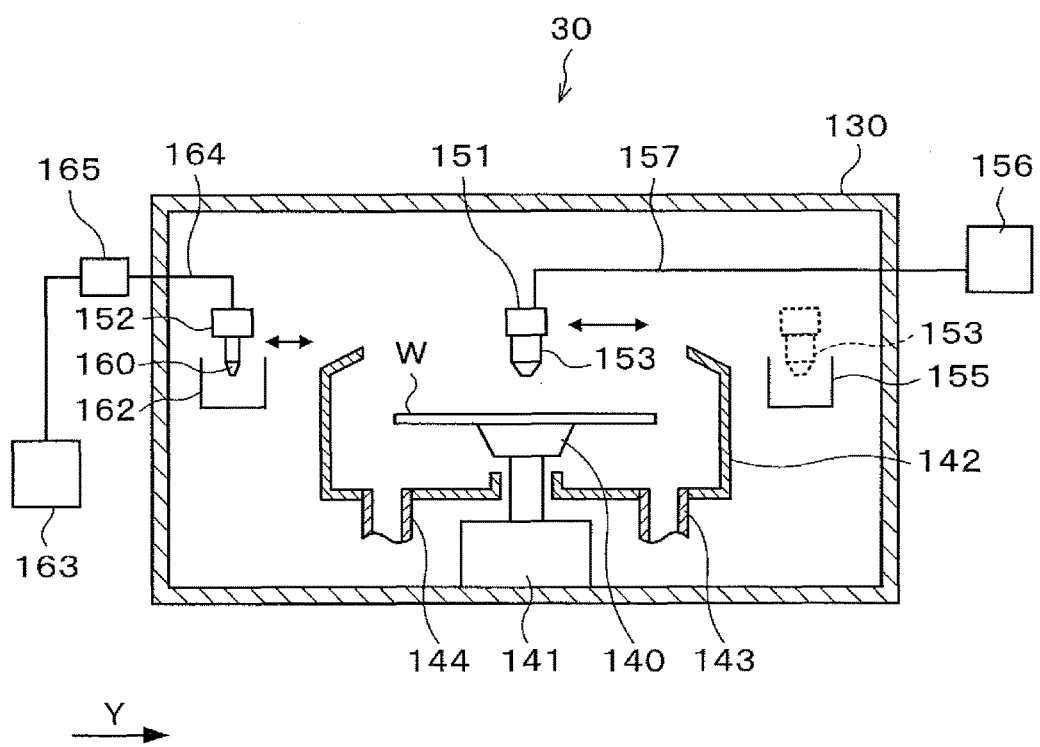
FIG. 6 A longitudinal sectional view illustrating the outline of a configuration of a developing apparatus.

Next, the configuration of the above-described developing apparatus 30 will be described. The developing apparatus 30 has a treatment container 130 having a transfer-in/out port (not illustrated) for the wafer W formed in a side surface as illustrated in FIG. 6.

In the treatment container 130, a spin chuck 140 is provided which holds and rotates the wafer W thereon. An upper surface of the spin chuck 140 is provided with a suction port (not illustrated) for sucking the wafer W. By suction through the suction port, the wafer W is suction-held on the spin chuck 140.

The spin chuck 140 can rotate at a predetermined speed by means of a chuck drive unit 141 such as a motor. Further, the chuck drive unit 141 is provided with a raising and lowering drive source (not illustrated) such as a cylinder so that the spin chuck 140 can freely rise and lower.

Around the spin chuck 140, a cup 142 is provided which receives and collects liquid splashing or dropping from the wafer W. The cup 142 is formed, at its upper surface, with an opening larger than the wafer W to allow the spin chuck 140 to rise and lower. A drain pipe 143 that drains the collected liquid and an exhaust pipe 144 that exhausts the atmosphere in the cup 142 are connected to the lower surface of the cup 142.

Figure 7:
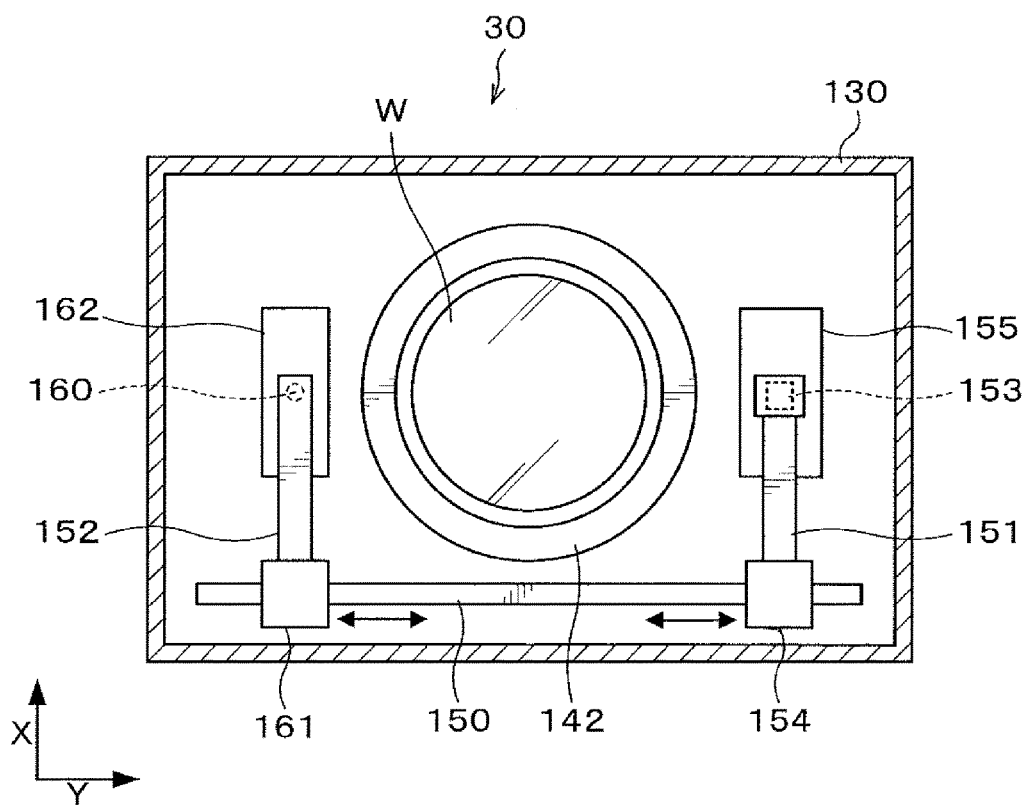
FIG. 7 A transverse sectional view illustrating the outline of a configuration of a thermal treatment apparatus.

As illustrated in FIG. 7, on an X-direction negative direction (lower direction in FIG. 7) side of the cup 142, a rail 150 extending along a Y-direction (right-left direction in FIG. 7) is formed. The rail 150 is formed, for example, from a Y-direction negative direction (left direction in FIG. 7) side outer position of the cup 142 to a Y-direction positive direction (right direction in FIG. 7) side outer position. To the rail 150, two arms 151, 152 are attached.

On the first arm 151, a supply nozzle 153 is supported which supplies a developing solution as illustrated in FIG. 6 and FIG. 7. The first arm 151 is movable on the rail 150 by means of a nozzle drive unit 154 illustrated in FIG. 7. Thus, the supply nozzle 153 can move from a waiting section 155 provided at the Y-direction positive direction side outer position of the cup 142 to a position above a central portion of the wafer W in the cup 142, and further move in a diameter direction of the wafer W above the front surface of the wafer W. Further, the first arm 151 can freely rise and lower by means of the nozzle drive unit 154 to be able to adjust the height of the supply nozzle 153.

To the supply nozzle 153, a developing solution supply pipe 157 is connected which communicates with a developing solution supply source 156 as illustrated in FIG. 6. Note that as the developing solution, for example, an alkaline TMAH solution is used.

On the second arm 152, a cleaning solution nozzle 160 is supported which supplies a cleaning solution, for example, pure water. The second arm 152 is movable on the rail 150 by means of a nozzle drive unit 161 illustrated in FIG. 7, and can move the cleaning solution nozzle 160 from a waiting section 162 provided at a Y-direction negative direction side outer position of the cup 142 to a position above a central portion of the wafer W in the cup 142. Further, the second arm 152 can freely rise and lower by means of the nozzle drive unit 161 to be able to adjust the height of the cleaning solution nozzle 160.

To the cleaning solution nozzle 160, a cleaning solution supply pipe 164 is connected which communicates with a cleaning solution supply source 163 as illustrated in FIG. 6. In the cleaning solution supply source 163, a cleaning solution is stored. The cleaning solution supply pipe 164 is provided with a supply equipment group 165 including a valve, a flow regulator and so on for controlling the flow of the cleaning solution. Note that the supply nozzle 153 that supplies the developing solution and the cleaning solution nozzle 160 that supplies the cleaning solution are supported on separate arms in the above configuration but may be supported on the same arm, and movements and supply timings of the supply nozzle 153 and the cleaning solution nozzle 160 may be controlled by controlling the movement of the arm.

The configurations of the organic solvent supply apparatus 31, the anti-reflection film forming apparatus 32, the neutral layer forming apparatus 33, the resist coating apparatus 34, and the block copolymer coating apparatus 35 which are the other solution treatment apparatuses are the same as that of the above-described developing apparatus 30 except that the solution to be supplied from the nozzle is different, and therefore description thereof is omitted. Note that in the organic solvent supply apparatus 31, a mixture made by mixing 20 wt % of an isopropyl alcohol (IPA) into the TMAH developing solution is used as the treatment solution to be supplied from the supply nozzle 153.

In the above substrate treatment system 1, a control unit 300 is provided as illustrated in FIG. 1. The control unit 300 is, for example, a computer and has a program storage unit (not illustrated). In the program storage unit, a program that controls the treatments on the wafer W in the substrate treatment system 1 is stored. The program storage unit further stores a program that controls the operations of the above-described various treatment apparatuses and a driving system such as transfer apparatuses to realize a later-described treatment in the substrate treatment system 1. Note that the programs may be the ones which are recorded, for example, in a computer-readable storage medium such as a computer-readable hard disk (HD), flexible disk (FD), compact disk (CD), magneto-optical disk (MO), or memory card, and installed from the storage medium into the control unit 300.

Figure 8:
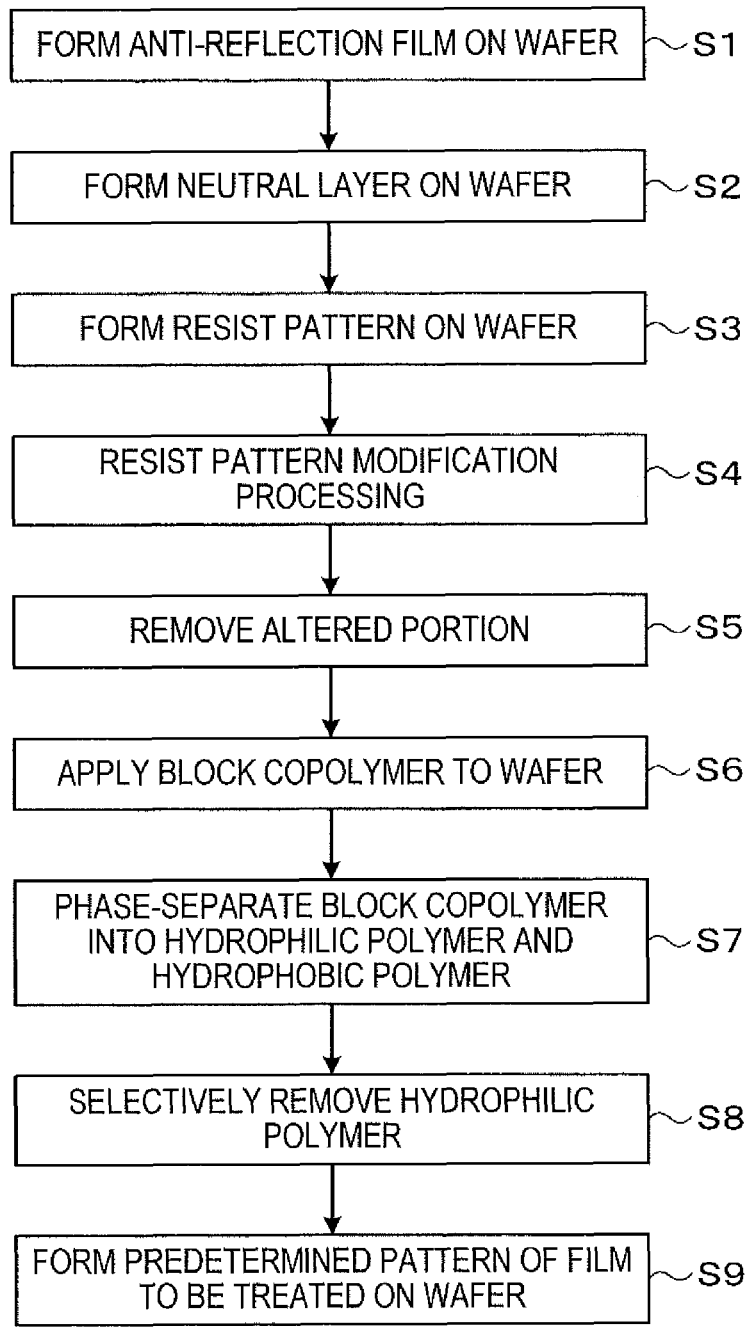
FIG. 8 A flowchart explaining main steps of a wafer treatment.

Next, a wafer treatment performed using the substrate treatment system 1 configured as described above will be described. FIG. 8 is a flowchart illustrating main steps of the wafer treatment.

First, the cassette C housing a plurality of wafers W is transferred into the cassette station 10 of the coating and developing treatment apparatus 2 and mounted on a predetermined cassette mounting plate 21. Then, the wafers W in each cassette C are sequentially taken out by the wafer transfer apparatus 23 and transferred to the delivery apparatus 53 in the treatment station 11.

Figure 9:
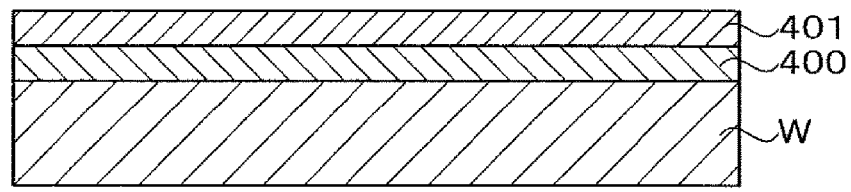
FIG. 9 An explanatory view of a longitudinal section illustrating an appearance that an anti-reflection film and a neutral layer are formed on a wafer.

Then, the wafer W is transferred by the wafer transfer apparatus 70 to the thermal treatment apparatus 40 and temperature-regulated. Thereafter, the wafer W is transferred by the wafer transfer apparatus 70 to the anti-reflection film forming apparatus 32, in which an anti-reflection film 400 is formed on the wafer W as illustrated in FIG. 9 (Step S1 in FIG. 8). The wafer W is then transferred to the thermal treatment apparatus 40 and heated and temperature-regulated.

Then, the wafer W is transferred by the wafer transfer apparatus 70 to the neutral layer forming apparatus 33. In the neutral layer forming apparatus 33, the neutralizing agent is applied onto the anti-reflection film 400 on the wafer W as illustrated in FIG. 9 to form a neutral layer 401 (Step S2 in FIG. 8). Thereafter, the wafer W is transferred to the thermal treatment apparatus 40 and heated and temperature-regulated, and then returned to the delivery apparatus 53.

Then, the wafer W is transferred by the wafer transfer apparatus 100 to the delivery unit 54. Thereafter, the wafer W is transferred by the wafer transfer apparatus 70 to the adhesion unit 42 and subjected to an adhesion treatment. The wafer W is then transferred by the wafer transfer apparatus 70 to the resist coating apparatus 34, in which the resist solution is applied onto the neutral layer 401 to form a resist film. Thereafter, the wafer W is transferred by the wafer transfer apparatus 70 to the thermal treatment apparatus 40 and subjected to a pre-bake treatment. The wafer W is thereafter transferred by the wafer transfer apparatus 70 to the delivery apparatus 55.

The wafer W is then transferred by the wafer transfer apparatus 70 to the edge exposure apparatus 43 and subjected to edge exposure processing. The wafer W is thereafter transferred by the wafer transfer apparatus 70 to the delivery apparatus 56.

The wafer W is then transferred by the wafer transfer apparatus 100 to the delivery apparatus 52 and transferred by the shuttle transfer apparatus 80 to the delivery apparatus 62.

The wafer W is thereafter transferred by the wafer transfer apparatus 110 in the interface station 13 to the exposure apparatus 12 and subjected to exposure processing.

Figure 10:
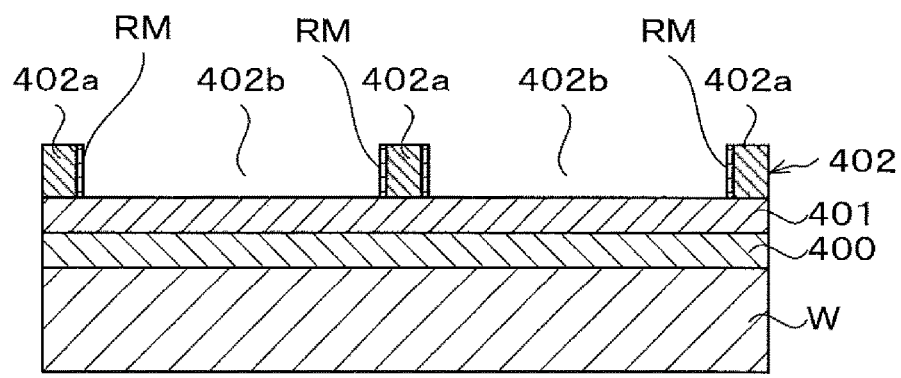
FIG. 10 An explanatory view of a longitudinal section illustrating an appearance that a resist pattern is formed on the wafer.

Then, the wafer W is transferred by the wafer transfer apparatus 110 from the exposure apparatus 12 to the delivery apparatus 60. Thereafter, the wafer W is transferred by the wafer transfer apparatus 70 to the thermal treatment apparatus 40 and subjected to a post-exposure bake treatment. The wafer W is thereafter transferred by the wafer transfer apparatus 70 to the developing apparatus 30 and developed. After the development ends, the wafer W is transferred by the wafer transfer apparatus 70 to the thermal treatment apparatus 40 and subjected to a post-bake treatment. Thus, a predetermined resist pattern 402 is formed on the neutral layer 401 on the wafer W as illustrated in FIG. 10 (Step S3 in FIG. 8).

Note that an altered portion RM that is a portion of the resist film changed in physical property exists on the side wall of the surface of the resist pattern 402 at the stage after the developing treatment ends. More specifically, this results from generation of resist films in the following states, in an intermediately exposed region that is an intermediate region between a region which has been exposed to light by the exposure processing (exposed region) and a region which has not been exposed to light because light is blocked out by a mask (unexposed region). Those are, firstly, a resist film in a state that exposure is sufficient and the resist film sufficiently dissolves in the developing solution under normal circumstances but remains undissolved because the resist film is located at an interface with the unexposed region, secondly, a resist film in a state that the resist film has been exposed but the exposure amount is not sufficient so that the resist film has not sufficiently dissolved in the developing solution but remains, and thirdly, a resist film in a state that the resist film has been subjected to little or no exposure and has not dissolved in the developing solution but remains. A portion in which the resist films in those states exist in a mixed manner is the altered portion RM. In the altered portion RM, the hydrophobic degree differs depending on the state of the resist film.

Note that in this embodiment, the resist pattern 402 has a linear line portion 402a and a linear space portion 402b in planar view and is thus a so-called line-and-space resist pattern. Besides, the width of the space portion 402b is set so that an odd number of layers of a hydrophilic polymer 405 and an odd number of layers of a hydrophobic polymer 406 are alternately arranged in the space portion 402b as will be described later.

The wafer W on which the resist pattern 402 has been formed is transferred by the wafer transfer apparatus 70 to the ultraviolet irradiation apparatus 41. In the ultraviolet irradiation apparatus 41, the ultraviolet light is applied to the resist pattern 402. In this event, ultraviolet light having a wavelength of 172 nm is applied, for example, for 5 seconds. Then, the altered portion RM generated in the intermediately exposed region, including the portion where the exposure amount is not sufficient and the portion which has been subjected to little or no exposure, is subjected to modification processing and made negative (Step S4 in FIG. 8).

Figure 11:
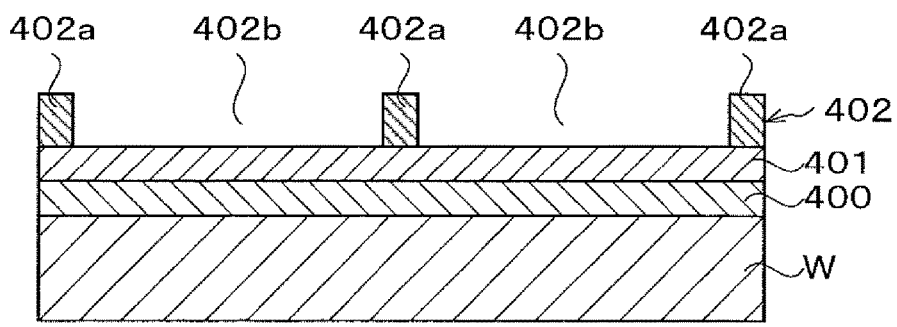
FIG. 11 An explanatory view of a longitudinal section illustrating an appearance that an altered portion on the resist pattern has been removed.

The wafer W is then transferred by the wafer transfer apparatus 70 to the organic solvent supply apparatus 31. In the organic solvent supply apparatus 31, the treatment solution made by mixing 20 wt % of the isopropyl alcohol into the TMAH developing solution is supplied onto the wafer W, whereby a surface treatment of the resist pattern 402 is performed. Thus, the altered portion RM remaining on the surface of the resist pattern 402 is removed as illustrated in FIG. 11 (Step S5 in FIG. 8). Thereafter, the wafer W is then transferred by the wafer transfer apparatus 70 to the delivery apparatus 50.

Figure 12:
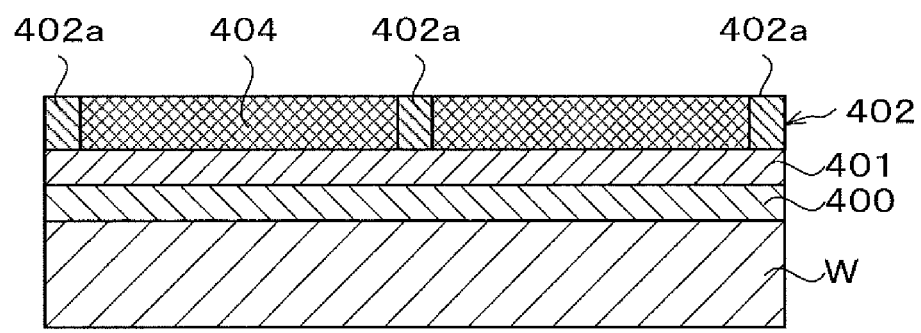
FIG. 12 An explanatory view of a longitudinal section illustrating an appearance that a block copolymer is applied on the wafer.

The wafer W is then transferred by the wafer transfer apparatus 100 to the delivery apparatus 55. The wafer W is then transferred by the wafer transfer apparatus 70 to the block copolymer coating apparatus 35. In the block copolymer coating apparatus 35, a block copolymer 404 is applied onto the neutral layer 401 on the wafer W as illustrated in FIG. 12 (Step S6 in FIG. 8).

Figure 13:
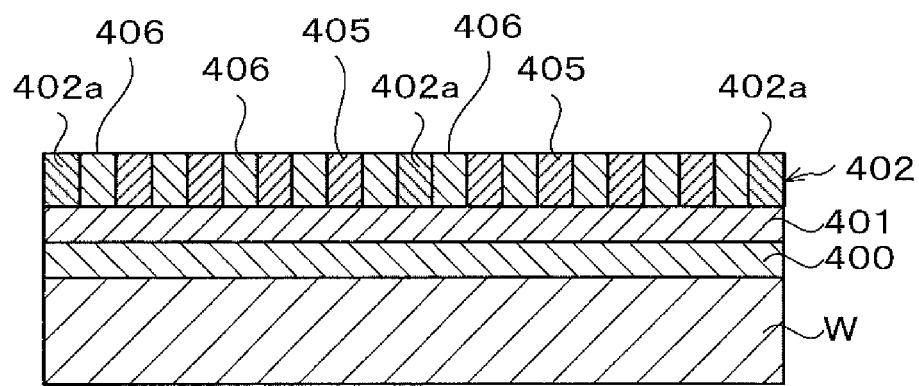
FIG. 13 An explanatory view of a longitudinal section illustrating an appearance that the block copolymer is phase-separated into a hydrophilic polymer and a hydrophobic polymer.
Figure 14:
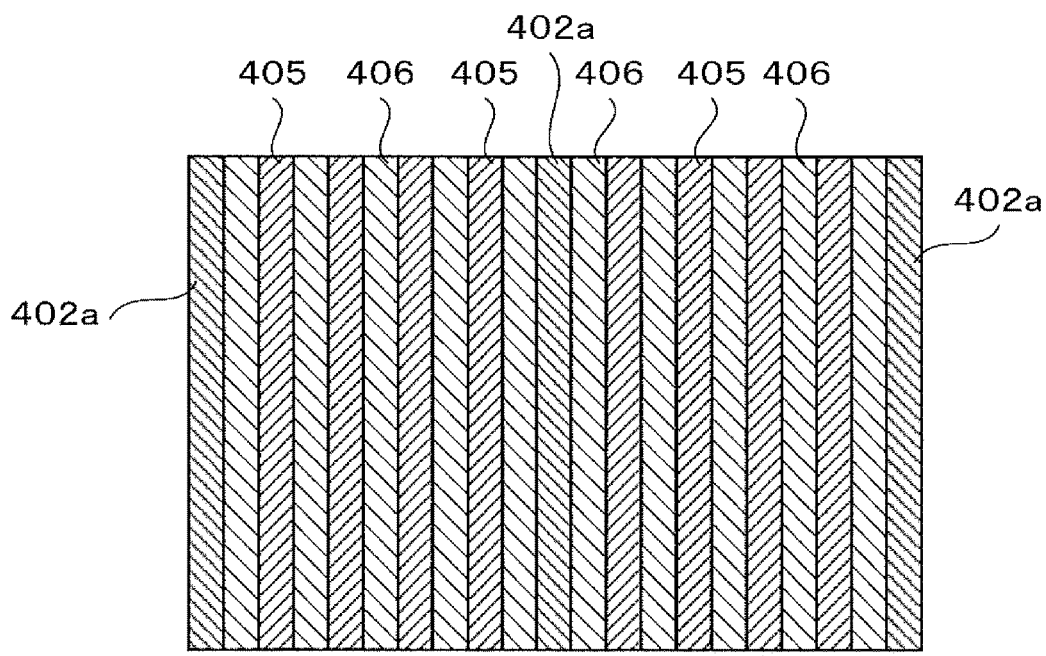
FIG. 14 An explanatory view of a plane illustrating the appearance that the block copolymer is phase-separated into the hydrophilic polymer and the hydrophobic polymer.

The wafer W is then transferred by the wafer transfer apparatus 70 to the polymer separation apparatus 44. In the polymer separation apparatus 44, a thermal treatment at a predetermined temperature is performed on the wafer W. Then, the block copolymer 404 on the wafer W is phase-separated into the hydrophilic polymer 405 and the hydrophobic polymer 406 as illustrated in FIG. 13 and FIG. 14 (Step S7 in FIG. 8).

Here, in the block copolymer 404, the ratio of the molecular weight of the hydrophilic polymer 405 is 40% to 60%, and the ratio of the molecular weight of the hydrophobic polymer 406 is 60% to 40%. Then, in Step S6, the hydrophilic polymer 405 and the hydrophobic polymer 406 are phase-separated into a lamellar structure as illustrated in FIG. 13 and FIG. 14. Besides, since the width of the space portion 402b in the resist pattern 402 is formed to be a predetermined width in the above-described Step S3, an odd number of layers of the hydrophilic polymer 405 and an odd number of layers of the hydrophobic polymer 406 are alternately arranged on the neutral layer 401. In this case, the altered portion RM has been removed from the surface of the resist pattern 402 so that resist pattern 402 that is an unexposed portion is bared, so that the hydrophobic degree never varies on the side wall on the surface of the resist pattern 402. Therefore, the resist pattern 402 has a sufficiently high hydrophobic property over the entire surface of the side wall. Therefore, the hydrophobic polymer 406 becomes more likely to be drawn to the resist pattern 402, so that the hydrophobic polymer 406 is arranged adjacent to the resist pattern 402. Then, the hydrophilic polymer 405 and the hydrophobic polymer 406 are alternately arranged adjacent to the aforementioned hydrophobic polymer 406, and the hydrophilic polymer 405 and the hydrophobic polymer 406 are alternately arranged also on the other region of the neutral layer 401.

Thereafter, the wafer W is transferred by the wafer transfer apparatus 70 to the delivery apparatus 50, and then transferred by the wafer transfer apparatus 23 in the cassette station 10 to the cassette C on the predetermined mounting plate 21.

After the predetermined treatments are performed on the wafers W in the coating and developing treatment apparatus 2, the cassette C housing the wafers W is transferred out of the coating and developing treatment apparatus 2 and then transferred into the etching treatment apparatus 3.

In the etching treatment apparatus 3, one wafer W is first taken out of the cassette C on the cassette mounting table 212 by the wafer transfer mechanism 210 and transferred into the load-lock apparatus 213a. After the wafer W is transferred into the load-lock apparatus 213a, the inside of the load-lock apparatus 213a is hermetically closed and reduced in pressure. Thereafter, the inside of the load-lock apparatus 213a is communicated with the inside of the transfer room chamber 214 exhausted to a predetermined degree of vacuum. The wafer W is then transferred by the wafer transfer mechanism 215 out of the load-lock apparatus 213a and into the transfer room chamber 214.

Figure 15:
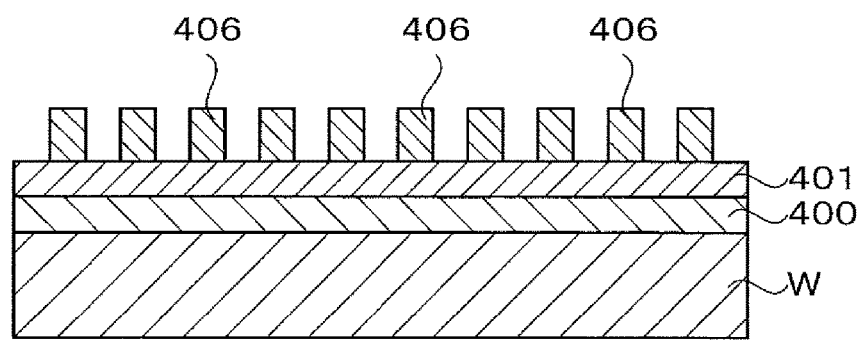
FIG. 15 An explanatory view of a longitudinal section illustrating an appearance that the hydrophilic polymer has been removed.

The wafer W transferred into the transfer room chamber 214 is then transferred by the wafer transfer mechanism 215 into the etching apparatus 202. In the etching apparatus 202, an etching treatment is performed on the wafer W, the hydrophilic polymer 405 and the resist pattern 402 are selectively removed as illustrated in FIG. 15 to form a predetermined pattern of the hydrophobic polymer 406 (Step S8 in FIG. 8).

The wafer W is thereafter transferred by the wafer transfer mechanism 215 to the etching apparatus 204. In the etching apparatus 204, the film to be treated on the wafer W is etched using the hydrophobic polymer 406 on the wafer W as a mask. Then, the hydrophobic polymer 406 and the anti-reflection film are removed to form a predetermined pattern in the film to be treated (Step S9 in FIG. 8).

Thereafter, the wafer W is returned again into the transfer room chamber 214 by the wafer transfer mechanism 215. Then, the wafer W is delivered to the wafer transfer mechanism 210 via the load-lock apparatus 213b and housed into the cassette C. Thereafter, the cassette C housing the wafers W is transferred out of the etching treatment apparatus 3, with which a series of wafer treatment end.

According to the above embodiment, the isopropyl alcohol is supplied as an organic solvent having a polarity to remove the altered portion RM on the surface of the resist pattern 402 at Step S5 to thereby bare an unexposed region, namely, the surface of the resist pattern 402 after development having a hydrophobic property over the entire side wall of the resist pattern 402, thereby making it possible to prevent the polymers 405, 406 from being disorderly arrayed when phase-separating the block copolymer 404 at Step S7 to thereby form a predetermined pattern. As a result, the etching treatment for the film to be treated using the pattern as a mask can be appropriately performed at Step S9 to thereby form a predetermined pattern in the film to be treated.

Note that the ultraviolet light of 172 nm is applied to modify the altered portion RM in the above embodiment. However, the inventors confirmed that the application of the ultraviolet light was not always necessary but supply of the treatment solution made by mixing 20 wt % of the isopropyl alcohol into the TMAH developing solution enabled removal of the altered portion RM. It is presumed that the resist in the above-described region where little or no exposure has been performed is insoluble in the TMAH developing solution but soluble in the isopropyl alcohol and the resist in the region where exposure has been performed but the exposure amount is not sufficient slightly dissolves both in the TMAH developing solution and the isopropyl alcohol. In addition, it is believed that supply of the mixed solution of the TMAH developing solution and the isopropyl alcohol causes dissolution of portions in the altered portion RM which are soluble to the solution and the alcohol. However, since the altered portion RM can be removed more surely and in a shorter time by applying the ultraviolet light to modify the altered portion RM, it is preferable to perform ultraviolet irradiation.

Besides, the wavelength of the ultraviolet light used to modify the altered portion RM does not have to be 172 nm but may be, for example, 222 nm. Note that it was confirmed that when the altered portion RM was modified with the ultraviolet light having a wavelength of 222 nm, the altered portion RM could be removed by supplying the TMAH developing solution to the wafer W. This is possibly because application of the ultraviolet light having a wavelength of 222 nm to the resist pattern 402 surely modifies the altered portion RM from positive to negative and the negative altered portion RM is washed away with the TMAH developing solution.

Note that though the altered portion RM is removed by supplying the organic solvent to the wafer W after the developing treatment on the resist pattern 402 in the above embodiment, the resist pattern 402 may be developed by supplying the treatment solution made by mixing 20 wt % of the isopropyl alcohol into the TMAH developing solution in the developing treatment performed on the resist pattern 402. The present inventors found no difference, regarding the removal of the altered portion RM, between the case of supplying the treatment solution made by mixing 20 wt % of the isopropyl alcohol into the TMAH developing solution to the resist pattern 402 which was irradiated with the ultraviolet light after development and the case of supplying this treatment solution to the wafer W after exposure processing and before development.

Though 20 wt % of the isopropyl alcohol mixed into the TMAH developing solution is supplied to the wafer W after the developing treatment on the resist pattern 402 in the above embodiment, the isopropyl alcohol may be supplied first to the resist pattern 402 after the developing treatment, and then the TMAH developing solution may further be supplied. Also in this case, it was confirmed that the altered portion RM could be removed as in the case of supplying the treatment solution made by mixing 20 wt % of the isopropyl alcohol into the TMAH developing solution. Note that since the portion soluble in the TMAH developing solution and the portion soluble in the isopropyl alcohol exist in a mixed manner in the altered portion RM as described above, it is more preferable to mix and supply the TMAH developing solution and the isopropyl alcohol from the viewpoint of dissolving both of the portions in parallel.

Though a so-called dry etching treatment is performed in the etching treatment apparatus 3 when selectively removing the hydrophilic polymer 405 in the above embodiment, the removal of the hydrophilic polymer 405 may be performed by a wet etching treatment.

More specifically, the wafer W for which the block copolymer 404 has been phase-separated at Step S7 is transferred to the ultraviolet irradiation apparatus 41 in place of the etching treatment apparatus 3 at Step S8. Then, the ultraviolet light is applied to the wafer W to cut the bonded chain of polymethyl methacrylate that is the hydrophilic polymer 405 and subject polystyrene that is the hydrophobic polymer 406 to cross-linking reaction. Thereafter, the wafer W is transferred again to the organic solvent supply apparatus 31, and, for example, the isopropyl alcohol (IPA) that is a polar organic solvent to the wafer W in the organic solvent supply apparatus 31. Thus, the hydrophilic polymer 405 whose bonded chain has been cut by irradiation of the ultraviolet light is dissolved and removed.

In the case of removing the hydrophilic polymer 405 by the so-called dry etching treatment, the selection ratio between the hydrophilic polymer 405 and the hydrophobic polymer 406 is, for example, about 3 to 7:1, so that film thinning of the hydrophobic polymer 406 cannot be avoided. On the other hand, in the case of removing the hydrophilic polymer 405 by the so-called wet etching using an organic solvent, the hydrophobic polymer 406 rarely dissolves in the organic solvent because of no polarity, so that film thinning can be avoided. As a result, when performing the etching treatment on the film to be treated using the pattern of the hydrophobic polymer 406 as a mask in the subsequent step, a sufficient thickness as the mask can be ensured.

Further, removing the hydrophilic polymer 405 by the wet etching makes it possible to omit the transfer of the wafer W from the above-described coating and developing treatment apparatus 2 to the etching treatment apparatus 3. Accordingly, the throughput of the wafer treatment in the substrate treatment system 1 can be improved.

Though the film to be treated on the wafer W is etched at Step S9 in the above embodiment, the wafer treatment method in the present invention is also applicable in etching the wafer W itself.

Though an example of the case of phase-separating the block copolymer 404 on the wafer W into the hydrophilic polymer 405 and the hydrophobic polymer 406 in the lamellar structure has been described in the above embodiment, the wafer treatment method of the present invention is also applicable to the case of phase-separating the block copolymer 404 into a hydrophilic polymer 405 and a hydrophobic polymer 406 in a cylinder structure.

Figure 16:
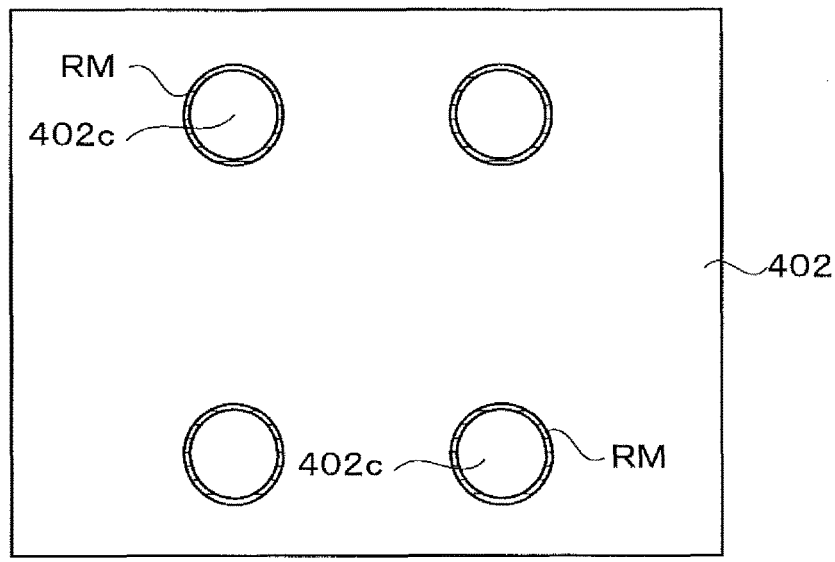
FIG. 16 An explanatory view of a plane illustrating an appearance that a resist pattern is formed on the wafer.
Figure 17:
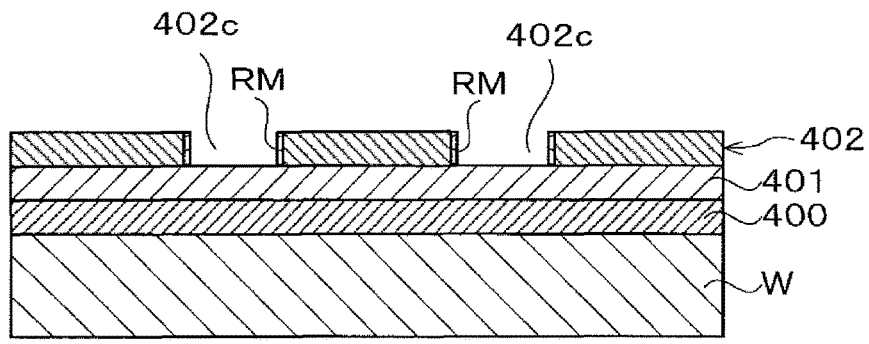
FIG. 17 An explanatory view of a longitudinal section illustrating an appearance that a resist pattern is formed on the wafer.
Figure 18:
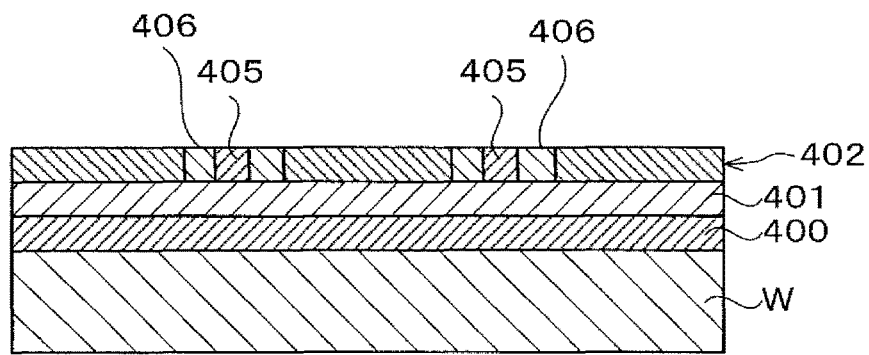
FIG. 18 An explanatory view of a longitudinal section illustrating an appearance that the block copolymer is phase-separated into a hydrophilic polymer and a hydrophobic polymer.
Figure 19:
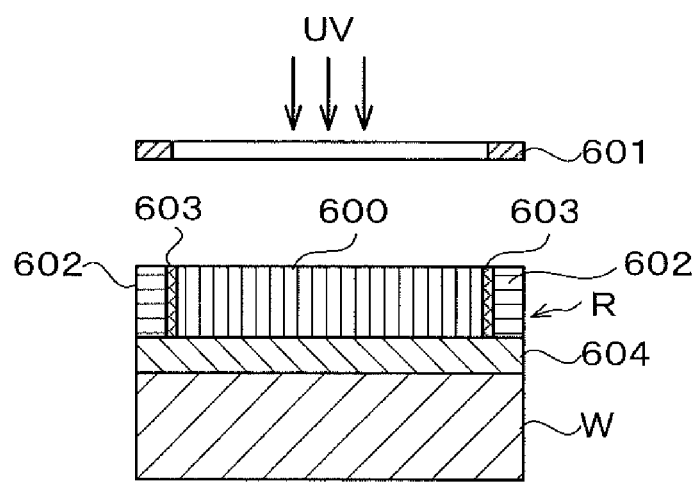
FIG. 19 An explanatory view of a longitudinal section illustrating an appearance that an intermediately exposed region is generated in a resist by exposure processing in a conventional wafer treatment.

The block copolymer 404 when phase-separated into the hydrophilic polymer 405 and the hydrophobic polymer 406 in the cylinder structure has a ratio of a molecular weight of the hydrophilic polymer 405 of 20% to 40% and a ratio of a molecular weight of the hydrophobic polymer 406 of 80% to 60%. In this case, at Step S3, the resist pattern 402 having a circular space portion 402c in planar view is formed on the wafer W as illustrated in FIG. 16, FIG. 17. Further, the altered portion RM exists also on the side wall on the surface of the resist pattern 402. Accordingly, modification and removal of the altered portion RM are performed at Steps S4 to Step S5.

Then, at Step S6, the block copolymer 404 is applied to the space portion 402c of the resist pattern 402 from which the altered portion RM has been removed. Thereafter, at Step S7, the block copolymer 404 is phase-separated. Since the altered portion RM has already been removed in this event, the hydrophilic polymer 405 and the hydrophobic polymer 406 can be prevented from being disorderly arrayed with respect to the resist pattern 402. The hydrophobic polymer 406 is more likely to be drawn to the resist pattern 402 having a hydrophobic property, so that the hydrophobic polymer 406 is arrayed in a cylindrical shape on the side wall side of the resist pattern 402 inside the space portion 402c and the hydrophilic polymer 405 in a cylindrical shape is arrayed at the center of the space portion 402c.

Note that the other steps S1 to S2, S8 to S9 are the same as those in the above embodiment, and therefore description thereof will be omitted.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention. The present invention is not limited to the embodiments but can take various forms. The present invention is also applicable to the case where the substrate is a substrate other than the wafer, such as an FPD (Flat Panel Display), a mask reticle for a photomask or the like.

INDUSTRIAL APPLICABILITY

The present invention is useful in treating a substrate, for example, using a block copolymer containing a hydrophilic polymer having a hydrophilic property and a hydrophobic polymer having a hydrophobic property.

EXPLANATION OF CODES 1 substrate treatment system
2 coating and developing treatment apparatus
3 etching treatment apparatus
30 developing apparatus
31 organic solvent supply apparatus
32 anti-reflection film forming apparatus
33 neutral layer forming apparatus
34 resist coating apparatus
35 block copolymer coating apparatus
40 thermal treatment apparatus
41 ultraviolet irradiation apparatus
42 adhesion apparatus
43 edge exposure apparatus
44 polymer separation apparatus
202 to 205 etching apparatus
300 control unit
400 anti-reflection film
401 neutral layer
402 resist pattern
402a line portion
402b, 402c space portion
404 block copolymer
405 hydrophilic polymer
406 hydrophobic polymer
W wafer

What is claimed:

1. A method of treating a substrate using a block copolymer containing a hydrophilic polymer and a hydrophobic polymer, the method comprising:
    a neutral layer forming step of forming, on the substrate, a neutral layer having an intermediate affinity to the hydrophilic polymer and the hydrophobic polymer;
    a resist pattern forming step of forming a resist pattern by performing exposure processing on a resist film formed on the neutral layer and then developing the resist film after the exposure processing, wherein the resist pattern is formed of an ArF resist;
    a resist pattern treatment step of performing a surface treatment on the resist pattern by supplying an organic solvent having a polarity to the resist pattern;
    a block copolymer coating step of applying the block copolymer onto the neutral layer;
    a polymer separation step of phase-separating the block copolymer on the neutral layer into the hydrophilic polymer and the hydrophobic polymer; and
    after the resist pattern forming step and before the resist pattern treatment step, a resist modification processing step of performing modification processing on a surface of the resist pattern by applying ultraviolet light to the resist pattern.

2. The substrate treatment method according to claim 1, wherein in the resist pattern forming step, the resist pattern forming step and the resist pattern treatment step are performed in parallel by supplying the organic solvent having a polarity in addition to a developing solution to the resist film after the exposure to develop the resist film.

3. The substrate treatment method according to claim 1, wherein the resist pattern treatment step is to remove the resist film existing in an intermediate region between an exposed region and an unexposed region of the resist film to bare a surface of the resist film in the unexposed region.

4. The substrate treatment method according to claim 1, further comprising:
    a polymer removing step of selectively removing either the hydrophilic polymer or the hydrophobic polymer from the phase-separated block copolymer.

5. The substrate treatment method according to claim 4, wherein in the polymer removing step, either the hydrophilic polymer or the hydrophobic polymer is selectively removed by plasma etching processing or by supply of an organic solvent.

6. The substrate treatment method according to claim 1, wherein the resist pattern is a pattern having a linear line portion and a linear space portion in planar view, and wherein a ratio of a molecular weight of the hydrophilic polymer in the block copolymer is 40% to 60%.

7. The substrate treatment method according to claim 1, wherein the resist pattern is a pattern having a circular space portion in planar view, and wherein a ratio of a molecular weight of the hydrophilic polymer in the block copolymer is 20% to 40%.

8. The substrate treatment method according to claim 1, wherein the hydrophilic polymer is polymethyl methacrylate, and wherein the hydrophobic polymer is polystyrene.

9. A method of treating a substrate using a block copolymer containing a hydrophilic polymer and a hydrophobic polymer, the method comprising:
    a neutral layer forming step of forming, on the substrate, a neutral layer having an intermediate affinity to the hydrophilic polymer and the hydrophobic polymer;
    a resist pattern forming step of forming a resist pattern by performing exposure processing on a resist film formed on the neutral layer and then developing the resist film after the exposure processing, wherein the resist pattern is formed of an ArF resist;
    a resist pattern treatment step of performing a surface treatment on the resist pattern by supplying an organic solvent having a polarity to the resist pattern;

a block copolymer coating step of applying the block copolymer onto the neutral layer; and a polymer separation step of phase-separating the block copolymer on the neutral layer into the hydrophilic polymer and the hydrophobic polymer;

wherein in the resist pattern forming step, the resist pattern forming step and the resist pattern treatment step are performed in parallel by supplying the organic solvent having a polarity in addition to a developing solution to the resist film after the exposure to develop the resist film, wherein the resist pattern treatment step, which is performed in parallel with the resist pattern forming step, is to remove the resist film existing in an intermediate region between an exposed region and an unexposed region of the resist film to bare a surface of the resist film in the unexposed region.

10. A non-transitory computer-readable storage medium storing a program running on a computer of a control unit controlling a substrate treatment system to cause the substrate treatment system to perform a method of treating a substrate using a block copolymer containing a hydrophilic polymer and a hydrophobic polymer, the substrate treatment method comprising:

a neutral layer forming step of forming, on the substrate, a neutral layer having an intermediate affinity to the hydrophilic polymer and the hydrophobic polymer;

a resist pattern forming step of forming a resist pattern by performing exposure processing on a resist film formed on the neutral layer and then developing the resist film after the exposure processing, wherein the resist pattern is formed of an ArF resist;

a resist pattern treatment step of performing a surface treatment on the resist pattern by supplying an organic solvent having a polarity to the resist pattern;

a block copolymer coating step of applying the block copolymer onto the neutral layer;

a polymer separation step of phase-separating the block copolymer on the neutral layer into the hydrophilic polymer and the hydrophobic polymer; and after the resist pattern forming step and before the resist pattern treatment step, a resist modification processing step of performing modification processing on a surface of the resist pattern by applying ultraviolet light to the resist pattern.

11. The non-transitory computer-readable storage medium according to claim 10, wherein in the resist pattern forming step, the resist pattern forming step and the resist pattern treatment step are performed in parallel by supplying the organic solvent having a polarity in addition to a developing solution to the resist film after the exposure to develop the resist film.

12. The non-transitory computer-readable storage medium according to claim 10, wherein the resist pattern treatment step is to remove the resist film existing in an intermediate region between an exposed region and an unexposed region of the resist film to bare a surface of the resist film in the unexposed region.

13. The non-transitory computer-readable storage medium according to claim 10, further comprising:

a polymer removing step of selectively removing either the hydrophilic polymer or the hydrophobic polymer from the phase-separated block copolymer.

14. The non-transitory computer-readable storage medium according to claim 10, wherein in the polymer removing step, either the hydrophilic polymer or the hydrophobic polymer is selectively removed by plasma etching processing or by supply of an organic solvent.

15. A system for treating a substrate using a block copolymer containing a hydrophilic polymer and a hydrophobic polymer, the system comprising:

a neutral layer forming apparatus that forms, on the substrate, a neutral layer having an intermediate affinity to the hydrophilic polymer and the hydrophobic polymer;

a developing apparatus that forms a resist pattern by performing a developing treatment on a resist film after exposure processing formed on the neutral layer, wherein the resist pattern is formed of an ArF resist;

a resist pattern treatment apparatus that performs a surface treatment on the resist pattern by supplying an organic solvent having a polarity to the resist pattern after the developing treatment;

a block copolymer coating apparatus that applies the block copolymer onto the neutral layer;

a polymer separation apparatus that phase-separates the block copolymer on the neutral layer into the hydrophilic polymer and the hydrophobic polymer; and a resist modification processing apparatus that performs modification processing on a surface of the resist pattern by applying ultraviolet light to the resist pattern after the resist pattern is formed and before the organic solvent is supplied to the resist pattern.

16. The substrate treatment system according to claim 15, wherein the developing apparatus supplies the organic solvent having a polarity in addition to a developing solution to the resist film after the exposure to perform a developing treatment on the resist film.

17. The substrate treatment system according to claim 15, wherein the resist pattern treatment apparatus removes the resist film existing in an intermediate region between an exposed region and an unexposed region of the resist film to bare a surface of the resist film in the unexposed region.

18. The substrate treatment system according to claim 15, further comprising:

a polymer removing apparatus that selectively removes either the hydrophilic polymer or the hydrophobic polymer from the phase-separated block copolymer.

19. The substrate treatment system according to claim 18, wherein the polymer removing apparatus is a plasma etching apparatus or a solvent supply apparatus that supplies an organic solvent, which selectively removes either the hydrophilic polymer or the hydrophobic polymer.

20. The substrate treatment system according to claim 15, wherein the resist pattern is a pattern having a linear line portion and a linear space portion in planar view, and wherein a ratio of a molecular weight of the hydrophilic polymer in the block copolymer is 40% to 60%.

21. The substrate treatment system according to claim 15, wherein the resist pattern is a pattern having a circular space portion in planar view, and wherein a ratio of a molecular weight of the hydrophilic polymer in the block copolymer is 20% to 40%.

22. The substrate treatment system according to claim 15, wherein the hydrophilic polymer is polymethyl methacrylate, and wherein the hydrophobic polymer is polystyrene.

* * * * *